United States Patent [19]

Wendt

[11] Patent Number: 5,128,627
[45] Date of Patent: Jul. 7, 1992

[54] PULSE POWER AMPLIFIER

[75] Inventor: Peter Wendt, Augsburg, Fed. Rep. of Germany

[73] Assignee: Siemens Aktiengesellschaft, Berlin and Munich, Fed. Rep. of Germany

[21] Appl. No.: 656,234

[22] Filed: Feb. 15, 1991

[30] Foreign Application Priority Data

Jun. 28, 1990 [EP] European Pat. Off. ........ 90112379.4

[51] Int. Cl.⁵ .............................................. H03F 1/14
[52] U.S. Cl. ...................................... 330/51; 330/53; 330/286; 330/284
[58] Field of Search ................... 330/51, 286, 53, 284, 330/144, 145; 333/101, 103, 109, 117

[56] References Cited

U.S. PATENT DOCUMENTS 4,016,503 4/1977 Rambo ................................ 333/109

FOREIGN PATENT DOCUMENTS 55-142404 11/1980 Japan ................................... 330/51

OTHER PUBLICATIONS

"Power Amplifiers for Airborne DME Applications", Application Note AV-201, Microwave Semiconductor Corporation, Date Code 0778-3M.

Primary Examiner—Eugene R. Laroche
Assistant Examiner—R. A. Ratliff
Attorney, Agent, or Firm—Hill, Van Santen, Steadman & Simpson

[57] ABSTRACT

A pulse power amplifier comprises a driver stage and a following splitter/combiner stage for symmetrical power division. The driver stage is preceded by a switch-over device in the signal path, the switch-over device also being connected to a decoupled port of the splitter/combiner stage via an additional signal path.

2 Claims, 1 Drawing Sheet

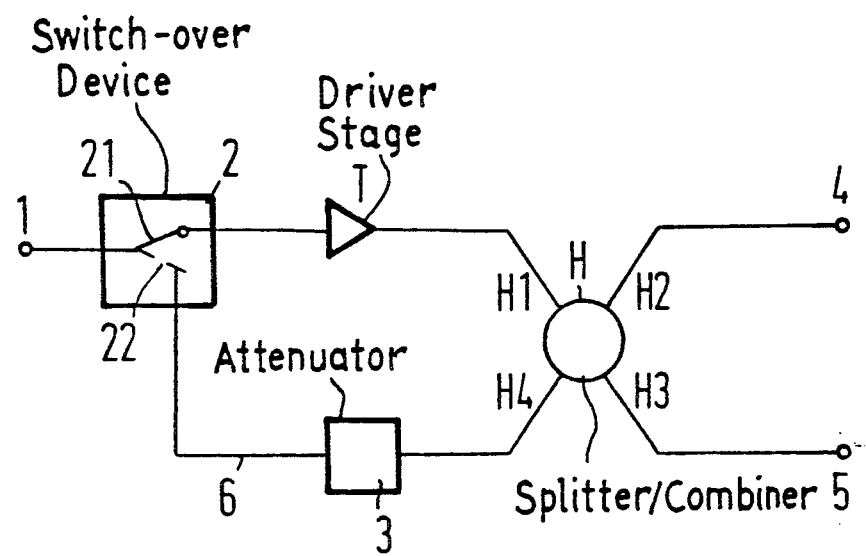

PULSE POWER AMPLIFIER

BACKGROUND OF THE INVENTION

1. Field of the Invention

The present invention relates to a pulse power amplifier of the type which comprises a driver stage and a splitter/combiner stage following the driver stage for symmetrical power division.

2. Description of the Prior Art

A pulse power amplifier of the type generally set forth above is known from the Application Note AV-201, Jun. 1978, of the Microwave Semiconductor Corporation.

High-frequency power transistors are employed for pulsed operation in pulse power amplifiers that generate peak pulse powers of 200W and above up into the GHz range. The obtainable pulse power of the individual transistors is limited and lies on the order of magnitude of 100W, dependent on the pulse format. For thermal reasons, the transistors thereby operate in the non-linear class C mode of operation and are only driven into the class A mode or class B mode during the gating process.

Higher output powers are achieved by parallel circuits having a plurality of transistors. The amplifier circuits thereby contain splitter/combiner stages as decoupling elements and in order to divide or, respectively, to combine the signals to be amplified or, respectively, the amplified signals. Dividers, in particular 3 dB power dividers or what are referred to as 3 dB hybrids are employed as splitter/combiner stages. Such "hybrid couplers" are known in the art, for example, from the catalog of the ANAREN Company. Power dividers such as 3 dB power dividers, are what are referred to as three-ports or four-ports that symmetrically divide power supplied at one port onto two other ports. In four-port power dividers, one port is always decoupled. In this connection, see R. K. Hoffmann, Integrierte Mikrowellenschaltungen, Springer Verlag, pp. 14–15. In the known amplifier circuits, this port is terminated with an absorber resistor.

The splitter/combiner stages are also employed given the division of the power supplied by the amplifier circuit onto two antennas.

In certain applications of pulse power amplifiers, it is not only a fixed, high output power that is required; rather, a maximum value and a minimum value of the output pulse power is required in view of low detectability and different distances to be bridged. The output pulse power can thereby differ by 10–30 dB.

It is conceivable to reduce the power output by the pulse power amplifier in that the drive power of one of the two output stage transistors connected in parallel to one another is disconnected on the basis of a switch-over device. What is referred to as a SPDT (single-pole, double-throw) switch can thereby be employed as a switch-over device. (In this connection, see Application of PIN Diodes, Application Note 922 of Hewlett Packard).

The switch losses must thereby be compensated by an increased driver power. Given reduced output power, the activated output stage transistor continues to work at full gain and power, this having a disadvantageous affect on the efficiency and on the reliability of the overall circuit.

SUMMARY OF THE INVENTION

The object of the present invention is to provide a pulse power amplifier that can be set to different output power levels.

The above object is achieved, according to the present invention in a pulse power amplifier comprising a driver stage and a following splitter/combiner stage for symmetrical power division, and which is characterized in that the driver stage is preceded by a switch-over device in the signal path, the switch-over device being connected to a decoupled port of the splitter/combiner stage via an additional signal path.

In the pulse power amplifier constructed in accordance with the present invention, at least one part of the power available at the input, given outage of the driver stage, can be coupled into the signal division at the output side.

BRIEF DESCRIPTION OF THE DRAWING

Other objects, features and advantages of the invention, its organization, construction and operation will be best understood from the following detailed description, taken in conjunction with the accompanying drawing, on which there is a single figure which is schematic representation of a pulse power amplifier constructed in accordance with the present invention.

DESCRIPTION OF THE PREFERRED EMBODIMENT

Referring to the drawing, an input pulse to be amplified is applied to a driver stage T via an input 1. The driver stage T can be constructed for control or regulation of the output power given simultaneous pulse shaping. Such methods for modulation of high-frequency power transistors are notoriously well-known in the art.

The input 1 is connected via a switch-over device 2 to the input side of the driver stage T in the first switch position 21 of the switch-over device 2. In a second switch position 22 of the switch-over device 2, the input 1 is connected to an additional signal path 6. The switch-over device 2, for example, may be realized by a SPDT switch as set forth above.

The driver stage T has it output side connected to a port H1 of a splitter/combiner stage H. The splitter/combiner stage H, for example, is realized by what is referred to as a four-port power divider that comprises two further ports H2, H3 for symmetrical power division that are respectively connected to two output terminals 4 and 5. Further amplifier stages or antennas can be connected to these output terminals 4 and 5.

As standard in four-port power dividers, the splitter/combiner stage H comprises a decoupled port H4. The port H4 is connected to the additional signal path 6 and , therefore, to the switch-over device 2 via, for example, an attenuation element 3. The attenuation element 3 has the same characteristic impedance as a terminating impedance that can be connected to the port H4.

In a first operating condition in which the switch-over device 2 is in its first switch position 21, the input pulses amplified via the driver stage T are coupled into the splitter/combiner stage H for a signal division of the output side. The full pulse power available is thereby output at the output terminals 4 and 5 in a first power level.

In a second operating condition, in which the switch-over device 2 is in its second switch position 22, the input pulse is coupled into the splitter/combiner stage H as a signal division of the output side via the attenuator 3. A reduced power is thereby output by the pulse power amplifier at a second power level. The two power levels output by the pulse power amplifier differ by a factor that is equal to the product of the gain of the driver stage T and the attenuation factor of the attenuator 3.

Given disconnect or outage of the driver stage T, the power applied at the input side can be coupled into the splitter/combiner stage H via the switch-over device 2 and, therefore, can be coupled into the signal division at the output side.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. A pulse power amplifier comprising:
    a driver stage including an input for receiving a pulse to be amplified, and an output;
    a splitter/combiner stage including first and second inputs and first and second outputs, said first input connected to said output of said driver stage;
    a switch-over device including an input for receiving the pulse to be amplified and first and second outputs, said first output connected to said driver stage, and said switch-over device operable to a first switch condition in which said input is connected to said first output in which a full pulse power is available for division at said first and second outputs of said splitter/combiner stage; and
    a signal path extending from said second output of said switch-over device to said second input of said splitter/combiner stage such that, in the second switch condition of said switch-over device, the pulse to be amplified may be provided for division to said first and second outputs of said splitter/combiner stage via said signal path at a reduced, second power level.

2. The pulse power amplifier of claim 1, wherein:
    said signal path comprises an attenuator connected between said second output of said switch-over device and said second input of said splitter/combiner stage.

* * * * *